United States Patent
Wu et al.

(10) Patent No.: US 8,461,036 B2
(45) Date of Patent: Jun. 11, 2013

(54) MULTIPLE SURFACE FINISHES FOR MICROELECTRONIC PACKAGE SUBSTRATES

(75) Inventors: Tao Wu, Chandler, AZ (US); Charavanakumara Gurumurthy, Gilbert, AZ (US); Reynaldo Alberto Olmedo, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 431 days.

(21) Appl. No.: 12/645,195

(22) Filed: Dec. 22, 2009

(65) Prior Publication Data
US 2011/0147933 A1 Jun. 23, 2011

(51) Int. Cl.
*H01L 21/00* (2006.01)
*H01L 21/44* (2006.01)
*H01L 23/00* (2006.01)
*H01R 43/20* (2006.01)
*H05K 3/10* (2006.01)
*C25D 5/12* (2006.01)

(52) U.S. Cl.
CPC ............... *H01L 21/00* (2013.01); *H01L 21/44* (2013.01); *H01L 2924/01028* (2013.01); *H01L 2924/01079* (2013.01); *H01L 2924/01046* (2013.01); *H01L 24/06* (2013.01); *H01R 43/205* (2013.01); *H05K 3/108* (2013.01); *C25D 5/12* (2013.01)
USPC ............... 438/614; 29/842; 29/884; 205/125; 205/181; 257/741; 257/E21.214; 257/E23.01; 257/E23.031; 438/106; 438/666; 438/678; 438/686

(58) Field of Classification Search
USPC .................. 257/738, E23.031, 741, E21.214, 257/E23.01; 174/257, 261, 250; 438/106, 438/111, 758, 584, 614, 650, 652, 666, 686; 228/180.22, 214, 215; 205/125, 181, 916; 29/842, 843, 884
See application file for complete search history.

(56) References Cited

U.S. PATENT DOCUMENTS

| | | | | |
|---|---|---|---|---|
| 5,656,550 | A * | 8/1997 | Tsuji et al. | 438/123 |
| 6,472,609 | B2 * | 10/2002 | Wakako et al. | 174/255 |
| 6,887,512 | B2 * | 5/2005 | Wakako et al. | 427/96.9 |
| 7,093,356 | B2 * | 8/2006 | Imafuji et al. | 29/847 |
| 7,216,424 | B2 * | 5/2007 | Wang | 29/843 |
| 7,340,829 | B2 * | 3/2008 | Wang | 29/852 |
| 8,183,467 | B2 * | 5/2012 | Kaneko | 174/261 |
| 8,319,115 | B2 * | 11/2012 | Ohsumi | 174/260 |
| 8,353,103 | B2 * | 1/2013 | Watanabe | 29/842 |
| 2002/0070438 | A1 * | 6/2002 | Ference et al. | 257/685 |
| 2004/0126547 | A1 * | 7/2004 | Coomer | 428/209 |
| 2006/0043156 | A1 * | 3/2006 | Debelius et al. | 228/180.22 |

(Continued)

OTHER PUBLICATIONS

PCT International Search Report, PCT/US2010/058239, International Filing Date Nov. 29, 2010, Intel Corporation et al.

*Primary Examiner* — Fernando L Toledo
*Assistant Examiner* — Victoria K Hall
(74) *Attorney, Agent, or Firm* — Blakely, Sokoloff, Taylor & Zafman LLP (57) ABSTRACT

Multiple surface finishes are applied to a substrate for a microelectronics package by applying a first surface finish to connection pads of a first area of the substrate, masking the first area of the substrate without masking a second area of the substrate, applying a second different surface finish to connection pads of the second area of the substrate, and removing the mask.

20 Claims, 7 Drawing Sheets

U.S. PATENT DOCUMENTS

| | | | |
|---|---|---|---|
| 2007/0269590 A1* | 11/2007 | Miyamoto et al. | 427/125 |
| 2008/0093109 A1* | 4/2008 | Hsu et al. | 174/250 |
| 2008/0217758 A1* | 9/2008 | Liao | 257/692 |
| 2009/0236739 A1* | 9/2009 | Chen et al. | 257/737 |
| 2009/0278255 A1* | 11/2009 | Oomori | 257/737 |
| 2009/0294962 A1* | 12/2009 | Hsu | 257/738 |
| 2010/0288541 A1* | 11/2010 | Appelt et al. | 174/257 |
| 2011/0089462 A1* | 4/2011 | Van Heerden et al. | 257/99 |

* cited by examiner

MULTIPLE SURFACE FINISHES FOR MICROELECTRONIC PACKAGE SUBSTRATES

FIELD

The present description relates to the field of applying surface finishes to connection areas of a substrate of a microelectronic package, and in particular to applying multiple different surface finishes to multiple different connection areas of a single substrate.

BACKGROUND

Semiconductor and micromechanical devices are typically attached to a substrate. A cover is then attached over the substrate to seal and protect the device inside. The cover can include heat fins or heat pipes or simply be a simple plastic cover that attaches to the outside edge of the substrate. The substrate makes the electrical and mechanical connections to a printed wiring board, a socket, or some other mount. The substrate with the cover attached is called a package. With the increasing complexity of packages and the devices inside new demands are being placed on the substrate and its connections both to the devices inside and to its external connections.

In some cases, a substrate might have different types of electrical connections. The electrical connections will have different electrical requirements for size, density, capacitance, impedance and other characteristics. When the connections on a substrate are created using silkscreen, photolithography, and other similar processes, it can be difficult to create different types of connections using a single set of manufacturing processes.

BRIEF DESCRIPTION OF THE DRAWINGS

Embodiments of the present invention are illustrated by way of example, and not limitation, in the figures of the accompanying drawings in which like reference numbers are used to refer to like features, and in which.

DETAILED DESCRIPTION

In some POP (Package on Package) substrates, both C4 (Controlled Collapse Chip Connection) and POP interconnect areas are present on the same substrate. A single surface finish does not optimize the performance of the interconnects. To improve performance, an electroless surface finish (i.e. NiPdAu) can be applied to the C4 pad with the POP pad masked. A dual C4 surface finish can be used to provide good solder joint reliability (SJR) for both C4 and POP pad interconnects. A new substrate fabrication process can be used to create two different types of surface finishes, one at the C4 side of an HDI (High Density Interconnect) POP (package-on-package) substrate and another at the POP pad side.

An electrolytic surface finish, i.e. NiAu, has been proven to be a good surface finish for drop performance. A high performance POP pad surface finish can be made by applying an electrolytic surface finish and routing all the POP pads to be connected to an electrolytic plating bar. However, an electrolytic surface finish cannot be applied to a C4 area due to the high density of pads and traces. Electroless surface finishes (i.e. NiPdAu) have been proven to be an excellent surface finish for solder joint reliability under electrical and thermal aging.

Figure 1:
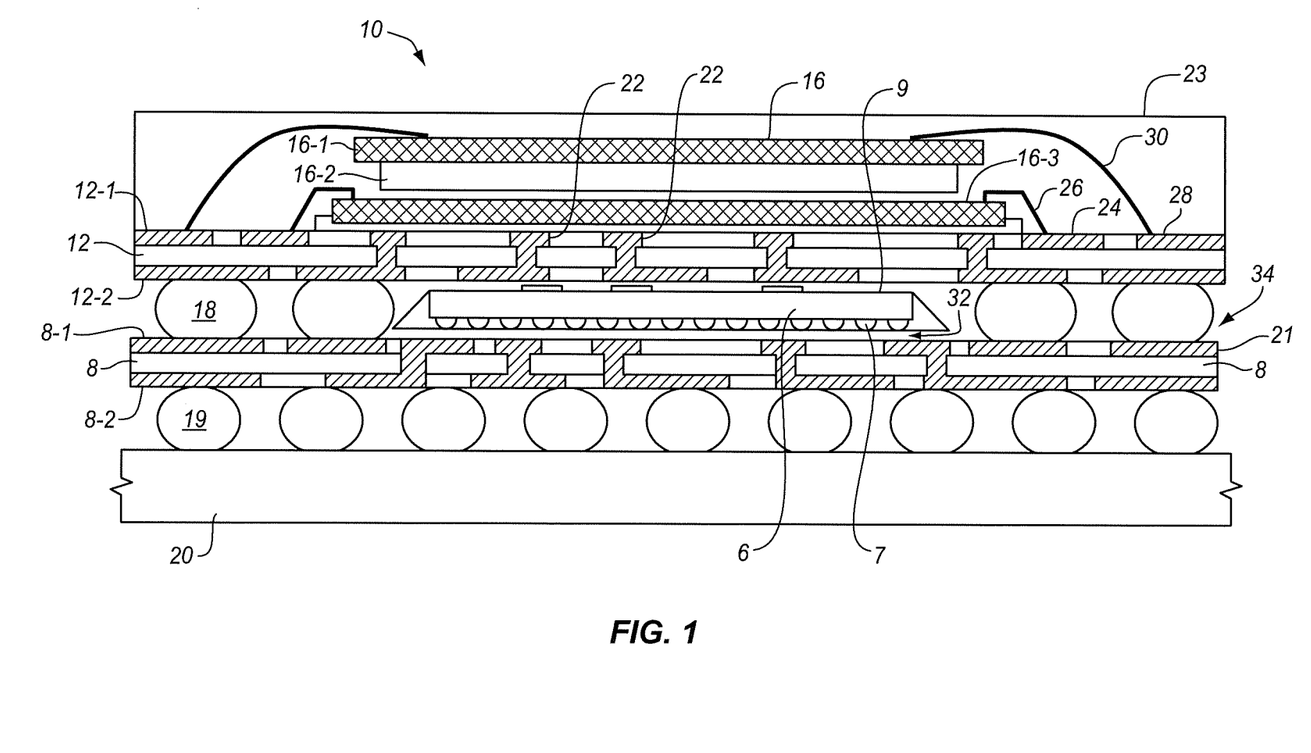
FIG. 1 is a side cross-sectional diagram of a package on package device according to an embodiment of the present invention.

FIG. 1 is a simplified cross-sectional diagram of a package to which embodiments of the present invention can be applied. In FIG. 1, the package 10 is a package-on-package (POP) type of package. A substrate 8 at the bottom of the package carries a first die 6 in a flip-chip configuration. In one example, the first die is a CPU (central processing unit), ASIC (Application specific integrated circuit), microcontroller, or other logic device. Its electrical connections are primarily on the bottom facing the die and are placed close together so that all of the desired pins can be fit onto the bottom surface of the die.

The flip chip die 6 has a C4 connection area 7 with a densely packed grid of solder bumps that connect with a corresponding C4 connection area 32 on the substrate 8. The top of the die is encapsulated with an appropriate cover or coating 9.

A second die or set of dies 16 is also contained in the package above the die and is spaced apart from the die by a second substrate 12. In the illustrated example, the second or upper die is stacked memory dies having three components 16-1, 16-2, 16-3 stacked together to form the second die. However, any other type of die or group of dies may be used. The combination of a logic device and memory in a single package has significant benefits for low power, small devices. However, any other two or more dies can be packaged together and the relative positions of the two dies can be reversed or adjusted to suit any particular application.

The upper substrate 12 connects directly to the second die 16 on one side, a top side 12-1. This connection typically provides electrical and mechanical support and is described in more detail below. On the opposite side of the upper substrate, the bottom side 12-2, the substrate connects to a ball grid array (BGA) 34. This connection is made up of an array of solder balls in the form of a grid or portion of a grid. The solder balls 18 make electrical connections between the upper substrate of the package 12 and the lower substrate 8 of the package 10. The attachment can be made in any of a variety of ways. In the illustrated example, the connection uses a ball grid array (BGA), of which several solder balls 18 of the array are shown. The solder balls are placed on connection pads 21 of the lower substrate of the package.

A cover 23 attaches to the periphery of the substrate and covers both dies and all of the internal connections. The cover provides protection from external elements and the attachment to the substrate can be a hermetic seal. The cover can include heat fins, heat spreaders, heat pipes or any of a variety of other cooling devices, (not shown). A second cover 9, similar to the upper cover, cover protects the flip chip die 6.

The top side of the upper substrate carries connections 22 to make direct contact with a bottom surface of the second or upper die. The particular type of connection can be adapted to suit any particular application. In the illustrated example solder bumps are used. FIG. 1 shows only five connections in the illustrated cross-sectional diagram. This is a simplified drawing. There may be tens or hundreds of connections. The connections contact the second die on one side, a top side, and then extend through vias to contact pads on the bottom side of the upper substrate. These contact pads can connect through the BGA on the bottom side of the substrate. This allows external connections to be made with the die 16.

In addition to the connections 22 between the substrate and the second die, such as a memory chip 16, the substrate also carries wiring pads 24 to which wires 26 are attached to connect to corresponding pads (not shown) on the tops of the memory dies 16. The wiring pads connect through vias to the BGA on the bottom of the substrate. In some applications, the wire connections are used for power, while the other connections on the top of the flip-chip die are used for high speed signaling or data.

Additional wiring pads 28 on the top side of the substrate are used to connect wires 30 to the top layers 16-1 of the memory stack. If this die is a memory die, then the lower density of connections typical in memory devices can easily be supported using wire connections rather than contact pads 22. These additional wiring pads can also be connected to the BGA through vias. In addition, the substrate can provide wiring layers to connect some pads, but not others to different points in the ball grid array. Accordingly, there can be several balls in the array for one pad and several pads on the substrate connected to one solder ball.

As explained above, the lower substrate connects on its top side 8-1 to the C4 contact area of the lower die and to the BGA contact area of the upper substrate. On its bottom side 8-2 it connects to a printed circuit board (PCB), printed wiring board (PWB), socket 20 or some other surface. The bottom side has a BGA 19 to connect to an array of pads on the PCB. Vias through the lower substrate 8 connect the contacts on the top side to contacts on the bottom side. While C4, wire bond, and BGA connections are shown, a wide range of different connections can be used. The particular low density and high density interconnects can be adapted to suit any particular application.

The example of FIG. 1 shows a schematic drawing of an HDI (High Density Interconnect) type POP device. Similar to a typical LDI (Low Density Interconnect) POP, the top part of the device, the upper die 16, is a memory chip package. But the bottom package is different from a typical LDI POP package. Instead of using wire bonding between the die and the substrate, an HDI type substrate 12 is used for the bottom package together with wire bonding. The interconnect between the die and the substrate is by flip chip to obtain the HDI area, although other types of chip configurations can be used. The substrate, accordingly, has an HDI area for the flip chip connection and an LDI are for the wire bond connections.

Figure 2:
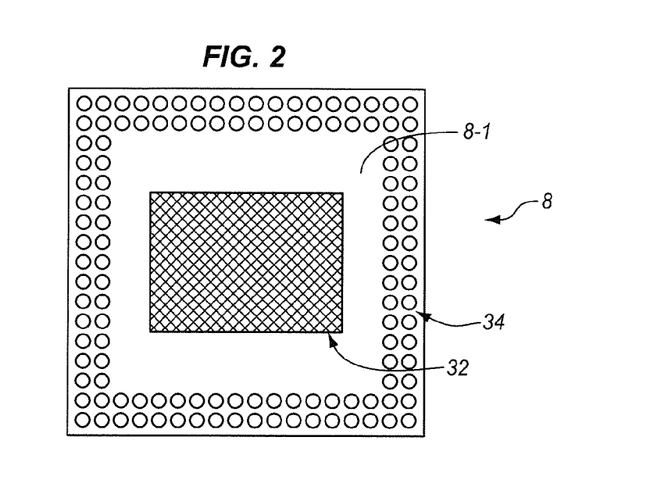
FIG. 2 is a top plan view of a package substrate with two different types of pad openings according to an embodiment of the present invention.

FIG. 2 shows a diagram of a top plan view 8-1 of the POP substrate 8 of FIG. 1. There are two types of pad openings. There is an HDI area 32, in this case a C4 area, to make the flip-chip connections with the lower die. Here, the connection pads are very dense and there are small openings for die interconnects.

At the substrate edge, surrounding the C4 area, is an LDI area 34 for the BGA that connects to the upper substrate that in turn connects to the wire bonds to the upper die. Here, the connections are low density and the pads have large openings. These will be called POP pads herein, which are used for the interconnection between the bottom and the top packages. In a conventional POP that relies on wire bonding all of the connections are low density pads of this type. The central HDI connections 32 connect to the lower die and the peripheral LDI connections 34 connect to the upper die through the upper substrate of the package.

Since the purpose and function of the C4 pad and the POP pad are different because they make different types of connections in different ways, the requirements of the pad surface finish to achieve solder joint reliability are very different. The C4 area solder joint is commonly protected by underfill, but needs strong reliability under electrical and thermal aging conditions. The underfill is a dielectric applied between the substrate and the die after the solder connection have been made to fill the space between the connections and protect them from physical, chemical, and thermal effects. On the other hand, the POP pad solder joint endures less signal or electrical aging requirements but needs higher drop test performance. There are other differences in the needs and requirements of these different connection types.

To provide clean, reliable, durable connections for both types of connection areas, different surface finishes can be used. One surface finish is used for the C4 pad and another surface finish is used for the POP pad areas. The example below will be presented in the context of C4 and POP pad connections, however, other types of connections and combinations of connections can benefit from different embodiments of the present invention.

An electrolytic surface finish, i.e. NiAu has been proven to be a good surface finish for drop performance. In one example an electrolytic surface finish, (i.e. NiAu) can be applied as a POP pad surface finish. In addition, all the POP pads can be routed to be connected to an electrolytic plating bar. However, an electrolytic surface finish does not work as well in a C4 area due to the high density of pads and traces. An electroless surface finish (i.e. NiPdAu) has been proven to be an excellent surface finish for good solder joint reliability under electrical and thermal aging. So an electroless surface finish (i.e. NiPdAu) can be applied to the C4 pad with the POP pad masked.

Figure 3:
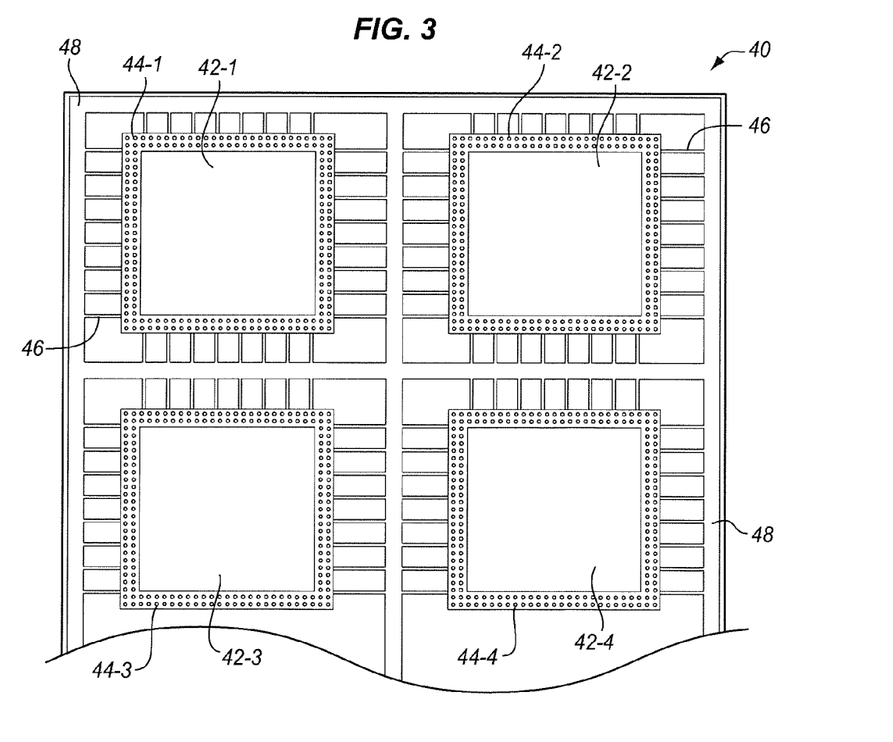
FIG. 3 is a top plan view of an alternative package substrate with two different types of pad openings and a connection bar around the periphery according to an embodiment of the present invention.

FIG. 3 shows a diagram of a top plan view of an alternative POP substrate. In the example of FIG. 3, the substrate 40 has four C4 areas 42-1 to 42-4. These are each surrounded with POP pad connection areas 44-1 to 44-4. The POP pads are coupled through wiring traces or lines 46 on the substrate to electrolytic plating bars 48 near the outer edge of the substrate. As in the example of FIG. 2, the POP pad areas surround the C4 contact areas. The electrolytic plating bars, in turn, surround the POP pad areas. In the illustrated example, the C4 connection area forms a square. The POP pads form a square around the C4 pad square. The plating bars form a square around the POP pad area and the wire traces connect the POP pads to the bars. The bars can then be connected through vias to BGA or other connectors on the bottom of the substrate (not shown). In the illustrated example, only the POP pads are routed to be connected to an electrolytic plating bar. However, a wide range of different wiring and routing variations are possible depending on the particular application.

FIGS. 4A through 4F show a process to prepare an HDI POP substrate with dual surface finishes or two different surface finishes. After the regular HDI build up processes and SR (Solder Resist) process, the POP pad's surface finish (i.e. NiAu) will be electrolytic plated. Then the POP pads will be masked and the C4 area pad's surface finish (i.e. NiPdAu) will be electroless plated. After the POP pad mark removal, the regular HDI process will be resumed.

One clear advantage for the new process is to meet the challenge for applying different surface finishes at a C4 area, a POP pad, and a BGA pad to meet different solder joint reliability requirements. Because of the dual surface finish at the C4 side of the substrate, there is no need for a sacrificial metal barrier layer.

Figure 4A:
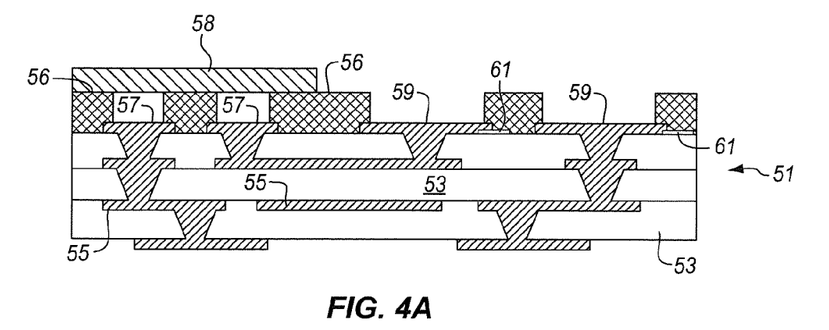
FIG. 4A is a cross-sectional diagrams of a process to prepare two different surface finishes to a package substrate according to an embodiment of the present invention.

Turning to FIG. 4A, a multilayer substrate 51 has dielectric areas 53 and conductive paths 55 such as vias through the dielectric areas to make connections between the top and bottom surfaces. Adapted for the example of FIG. 1, the substrate of FIG. 4A would have BGA pads on the bottom surface and in the figures that follow is developed to support C4 and POP pad connections on the top surface.

In the example of FIG. 4A, the C4 connections are on the left and the POP pads are on the right. The solder resist process has been completed to reveal and define two conductive vias 57 for the C4 connections below the top layer of solder resist 56. There are two conductive vias 59 for the POP pads also below the top layer of solder resist. The two POP pads are connected through a wire line 61 in the substrate to a strip edge. This corresponds to the wire lines 46 between the POP pads and the electrolytic plating bar 48 in FIG. 3.

In FIG. 4A, the left side C4 connection area is masked. The mask 58 protects the C4 connection area while the POP pad area receives a surface finish. The mask may be made using photoresist or any of a variety of other protective films. In one example, the mask is made of a selective paste print film. Similarly, the mask can be patterned using photolithography, printing or other techniques. As a further alternative, the order of preparing the surfaces can be reversed, so that the POP pad area is finished first, then masked, and then the C4 connection area is finished.

Figure 4B:
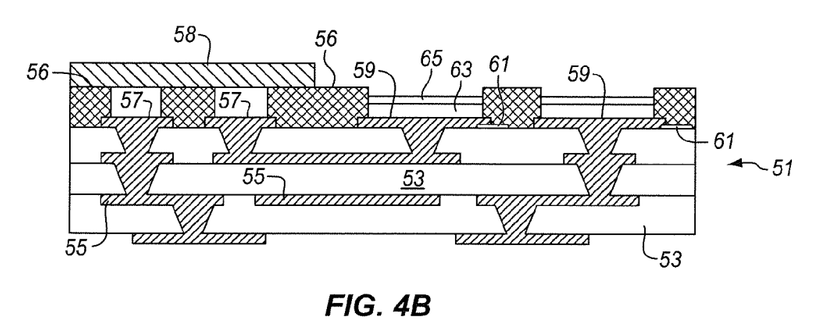
FIG. 4B shows adding a POP pad area surface finish to the package substrate of FIG. 4A according to an embodiment of the present invention.

In FIG. 4B, an electrolytic surface finish has been applied to the vias on the right hand side for the POP pads. In this example, the surface finish is a NiAu layer. First a nickel layer 63 is applied by masking the other areas and applying a wet nickel ion bath. Next a gold layer 65 is formed by applying a wet gold bath. While electrolytic NiAu is shown there are a variety of other possible surface finishes that can be applied to optimize the quality and function of the POP pads. Alternatively, a variety of other surface finishes can be used such as electrolytic NiPdAu, electrolytic PdAu, or electrolytic NiPd, among others.

Figure 4C:
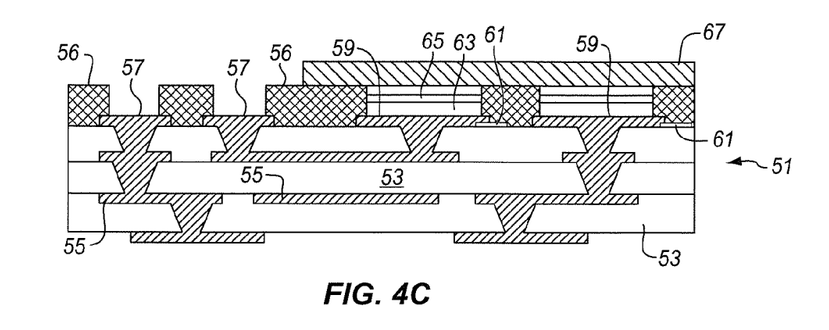
FIG. 4C shows adding a protective mask to the package substrate according to an embodiment of the present invention.

In FIG. 4C, the mask over the left side C4 connection area is removed and the right side POP pad area is masked. The right side mask 67 protects the POP pad area while the C4 area receives a surface finish. The mask may be made in the same way as the mask in FIGS. 4A and 4B. In both cases the mask pattern can be established by photolithography techniques or selective printing or in any of a variety of other ways.

Figure 4D:
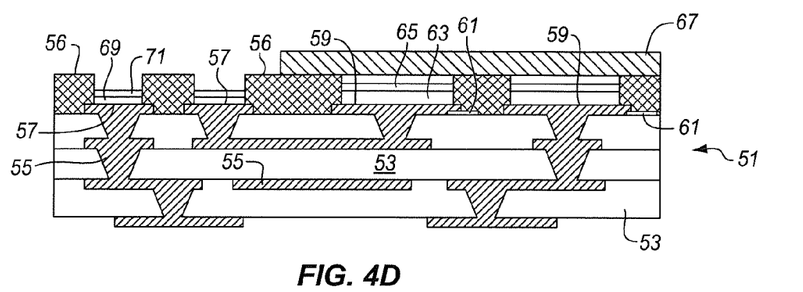
FIG. 4D shows applying a surface finish to a C4 connection area of the package substrate according to an embodiment of the present invention.

In FIG. 4D, a layer of nickel, palladium is formed over the conductive paths 55 where the C4 contacts are to be made. A layer of gold is then formed over the nickel, palladium layer. The nickel palladium are applied with an electroless process and the gold is applied with an immersion process. While a NiPdAu process is illustrated, a variety of other finishes suitable for C4 connections can be used depending on the application.

Figure 4E:
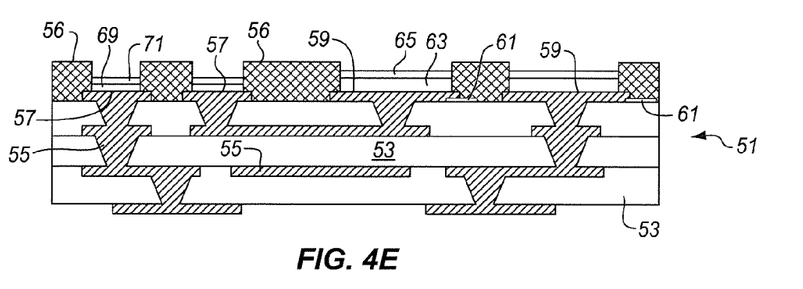
FIG. 4E shows removing the protective mask from the package substrate according to an embodiment of the present invention.
Figure 4F:
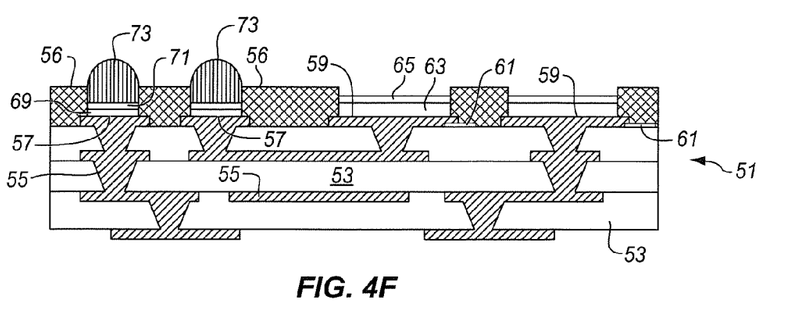
FIG. 4F shows adding C4 solder bumps to the package substrate according to an embodiment of the present invention.

In FIG. 4E, the mask 67 is removed from the POP pad area and in FIG. 4E, C4 solder bumps 73 are applied over the C4 connection points. The resulting substrate now shows two different types of connection areas with two different types of surface finishes. In the illustrated example, the protective mask is removed before the solder bumps are applied. This protects the mask from the heat of the solder bump process. With different mask materials, the mask may be removed later.

Each of the operations mentioned above typically involve many additional operations that are not described above, such as masking, cleaning, printing, plating evaporating, drying, heating, etc. These operations are not described in detail in order to simplify the description. The operations can be modified in a variety of different ways depending on the particular surface finishes that are used for any particular application.

The operations of FIGS. 4A to 4F can be applied to a many different types of substrates with two different contact areas. Another example of such a substrate is a coreless substrate. The C4 side of an HDI POP with a DLL3 (Direct Layer and Lamination)-D type coreless substrate also presents two different connection areas. At the same time, the process can facilitate a desirable surface finish at the BGA side which is opposite the two connection areas. While a variety of different surface finishes can be used for the BGA side, one possibility is a Direct Immersion Au (DIG) surface finish.

One clear advantage for the new process is to meet the challenge for applying different surface finishes at a C4 area, a POP pad, and a BGA pad to meet different solder joint reliability requirements. Because of the dual surface finish at the C4 side of the substrate, there is no need for a sacrificial metal barrier layer. FIGS. 5A to 5J show an alternative process to achieve HDI POP substrate duo surface finishes. Taking advantage of a DLL3-D type package process, a C4 area surface finish (e.g. NiPdAu) can be first electrolytic plated by patterning the C4 area only. After the C4 area plating is done and the dry film resist is removed, the POP pad area can be patterned for a different type of electrolytic surface finish plating (e.g. NiAu). After the regular HDI build up processes and solder resist processes, a different desirable BGA pad surface finish, such as DIG (Direct Immersion Gold) or OSP (Organic Solderability Preservative), can be applied.

Figure 5A:
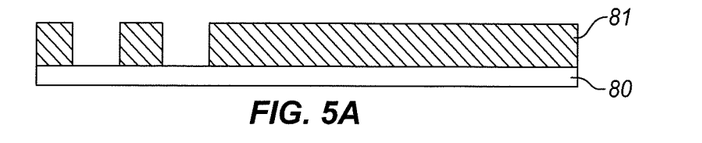
FIG. 5A is a cross-sectional diagram of an alternative process to prepare three different surface finishes to a package substrate according to an embodiment of the present invention.
Figure 5B:
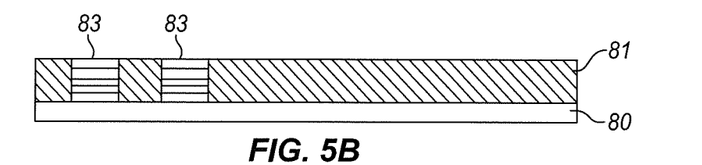
FIG. 5B shows adding a surface finish to a C4 connection area of the coreless substrate of FIG. 5A according to an embodiment of the present invention.
Figure 5C:
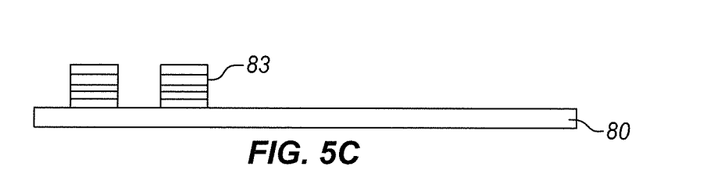
FIG. 5C shows removing a resist pattern from the coreless substrate according to an embodiment of the present invention.

Referring to FIG. 5A, an initial copper film or sheet 80 is shown with a patterned dry film resist (DFR) layer 81. As can be seen in the following drawing figures, the initial sheet forms the foundation for building a coreless substrate and is eventually removed. The DFR layer defines the positions of the C4 contact solder bumps. In FIG. 5A the opening in the DFR layer are filled with an electrolytic AuPdAu layer 83. This can be done with a variety of electrolytic processes and the particular composition of the layers can be adapted to suit different applications. In FIG. 5C, the DFR layer is removed leaving the C4 connection points on the coreless substrate.

Figure 5D:
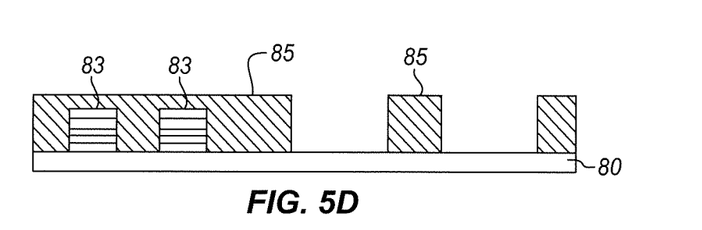
FIG. 5D shows adding resist patterning for a POP pad area to the coreless substrate according to an embodiment of the present invention.
Figure 5E:
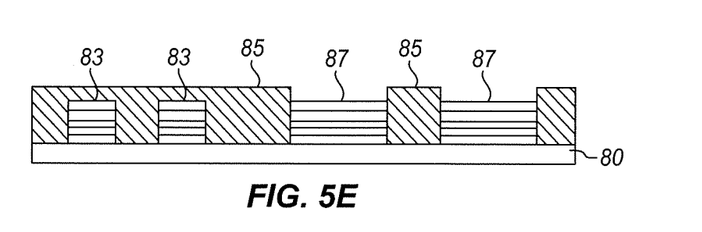
FIG. 5E shows adding a surface finish to the C4 connection area of the coreless substrate according to an embodiment of the present invention.

In FIG. 5D, a new DFR layer 85 is patterned onto the substrate. The new layer covers and protects the C4 connection areas and defines locations for the POP pad area. In FIG. 5E, the gaps in the patterned DRF layer 85 have an electrolytic AuNi layer 87 deposited within them. This can be performed in a variety of different ways as discussed above in the context of FIG. 4B. The particular choice of materials and process for this surface finish can be adapted as desired to suit any particular embodiment.

Figure 5F:
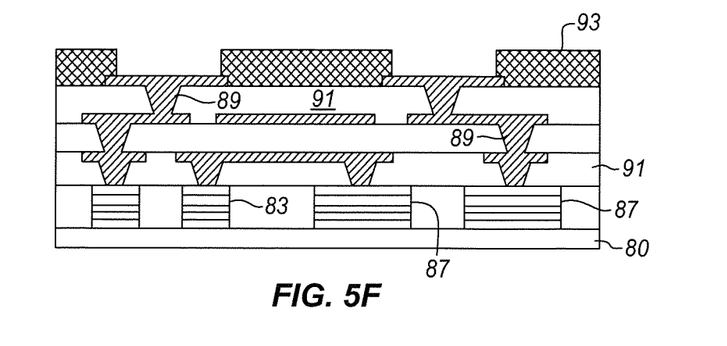
FIG. 5F shows adding multilayer connections and dielectric and a resist pattern to the coreless substrate according to an embodiment of the present invention.

In FIG. 5F, several new operations have been applied to the coreless substrate. First, the DFR layer 85 has been removed. Next, layers of dielectric 91 and conductive vias and interconnects 89 have been built up over the C4 and POP pad connection area. These layers are built up through a sequence of patterning, depositing, etching, and repeating. A variety of different processes can be used to achieve these layers. After the vias and interconnects have been formed, solder resist 93 is patterned over the resulting surface. The solder resist is patterned to define the locations of the eventual ball connections of the ball grid array. Finally in FIG. 5F, each opening for a ball in the patterned solder resist has been coated with a layer of copper. The copper does not have a surface finish yet.

Figure 5G:
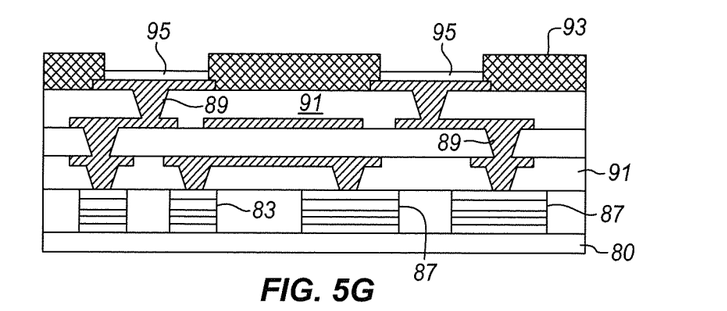
FIG. 5G shows adding a surface finish to a BGA connection area of the coreless substrate according to an embodiment of the present invention.

In FIG. 5G, an appropriate surface finish 95 has been applied to the BGA wells. The surface finish may be any finish desired and appropriate for a BGA connection pad. If the connection pad is of another type, then a different surface finish can be used. A DIG or OSP surface finish can be used in one embodiment.

Figure 5H:
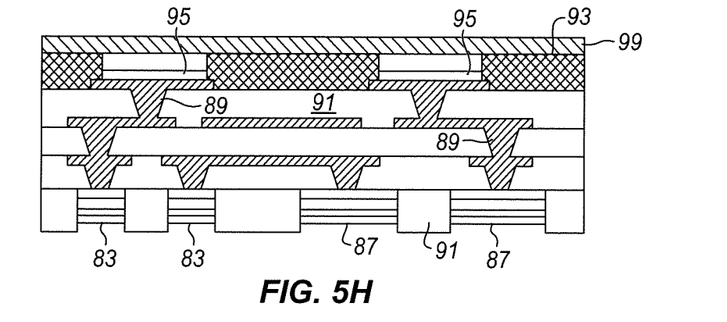
FIG. 5H shows applying a protective film over the BGA connection area and etching a copper layer from the bottom of the coreless substrate according to an embodiment of the present invention.

In FIG. 5H a protective film 99 is laminated over the BGA wells. The film may be made of PET (polyethylene terephthalate) or a variety of other materials and in this example is laminated over the wells. The lamination protects the BGA contact areas while the bottom layer of copper 80 is etched from the bottom side of the coreless substrate. Removing the bottom layer of copper exposes the contact areas for the C4 83 and POP pad 87 areas. With the dielectric barriers 91 that were added in FIG. 5F, the bottom contact pads are inside of inverse wells.

Figure 5I:
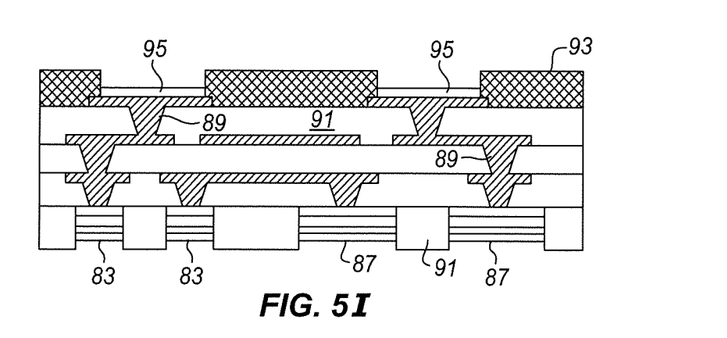
FIG. 5I shows removing the protective film from the coreless substrate according to an embodiment of the present invention.
Figure 5J:
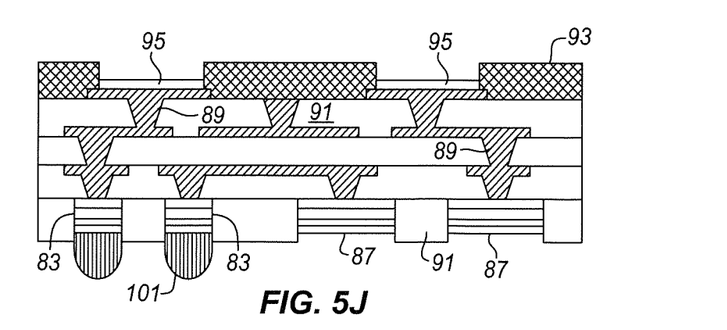
FIG. 5J shows applying C4 connection solder bumps to the coreless substrate according to an embodiment of the present invention.

In FIG. 5I, the protective film 99 is removed. This figure shows the exposed BGA contacts on the top of the coreless substrate and the two different types of contacts, C4 and POP pad on the bottom of the coreless substrate. The top contacts are ready to make contact with solder balls through the gold surface finish in each well. The POP pads have an electrolytic gold nickel surface finish to receive wires for wire bonds. The C4 pads are ready for C4 solder bumps or microballs that will be applied to the electrolytic gold, palladium, gold surface finish. In FIG. 5J, the C4 solder bumps 101 have been applied in place on the bottom surface of the coreless die.

The process of FIGS. 5A to 5J allows different surface finishes to be applied at a C4 area, a POP pad and a BGA pad to meet different solder joint reliability requirements. In addition, an electrolytic NiAu surface finish can be applied at the POP pad surface without routing all the POP pads to be connected to an electrolytic plating bar. This avoids the design challenge and reliability concerns that might be caused by exposing the many copper traces that would be required to connect to a common bar (see e.g. FIG. 3, 46, 48).

Figure 6:
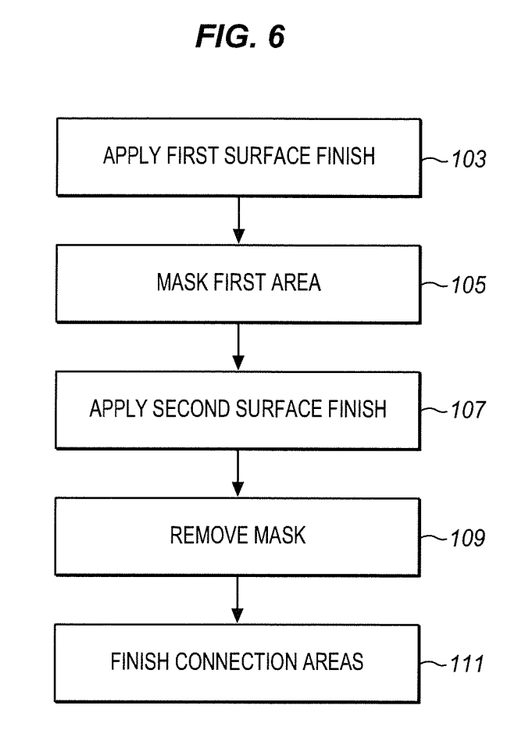
FIG. 6 is a process flow diagram of producing multiple surface finishes on a substrate according to an embodiment of the present invention.

FIG. 6 is a process flow diagram of producing multiple surface finishes on a substrate according to an embodiment of the invention. In FIG. 6, at block 103, a first surface finish is applied to a first area of a substrate. The first area of the substrate can be a low or high density connection interface. In the case of a LDI are, the connection may be a POP pad area, a wire bond area or a BGA area. The first surface finish is selected based on the properties of the connection area. For an LDI area an electrolytic surface finish such as electrolytic NiAu can be used, among others. Alternatively, DIG, OSP and similar finishes can be used.

At block 105, the first area of the substrate is masked. This is done to leave a second area of the substrate that has a second different connection area exposed. The second connection area can be a similar density to the first but with different connection requirements or it can be a different density. For example, it can be a high density area, such as a C4 connection area.

At block 107 a second different surface finish is applied to the second area of the substrate, while the first area is masked. In the case of a C4 connection area, an electroless surface finish of NiPdAu can be used. However other types of finishes can also be used for C4 and other types of connection areas.

At block 109, the mask is removed, and at block 111, the connection areas are finished. This can be done by adding solder balls or bumps, wire connection additional pads, or some other structure that is suitable for the particular connection area that are used.

The two connection areas can be beside each other or space apart. They can be on the same side of a substrate or on opposite sides of the substrate. The low density area can be finished before the high density area or vice versa. In one example, shown above, the first connection area is on a top surface of the substrate and the second connection area is on a bottom surface of the substrate opposite the top surface.

Additional areas can be finished by masking some of the connection areas while applying surface finishes to others.

Various operations are described as multiple discrete operations to aid in understanding the description. However, the order of description should not be construed to imply that these operations are necessarily order dependent. In particular, these operations need not be performed in the order of presentation. Operations described may be performed in a different order than the described embodiment. Various additional operations may be performed and described operations may be omitted.

Many modifications and variations are possible in light of the above teachings. Various equivalent combinations and substitutions may be made for various components and operations shown in the figures. The scope of the invention is not to be limited by this detailed description, but rather by the claims appended hereto.

The example layering, coating, etching and patterning processes described above are provided only as examples. There may be other and different processes that apply different surface finishes to different types of connection areas on different types of substrates. The particular types of connection areas, packages, and surface finishes are provided only as examples and different selections may be made to suit different applications.

A lesser or more complex surface finish, package and fabrication process may be used than those shown and described herein. Therefore, the configurations may vary from implementation to implementation depending upon numerous factors, such as price constraints, performance requirements, technological improvements, or other circumstances. Embodiments of the invention may also be applied to other types of packages and connections that benefit from different types of surface finishes. In addition, embodiments of the invention may be applied to the production of semiconductors, microelectronics, micromachines and other devices that use photolithography technology.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In addition, steps and operations may be removed or added to the operations described to improve results or add additional functions. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A method comprising:
    applying a first surface finish to connection pads of a first type located in a first area of a surface of a substrate;
    forming a mask on the first area of the substrate and exposing a second area of the same surface of the substrate, wherein the second area of the substrate comprises a high density connection interface;
    applying a second different surface finish to connection pads of a second type located in the second area of the substrate, wherein the second surface finish is an electroless NiPdAu surface finish; and
    removing the mask.

2. The method of claim 1, wherein the first area of the substrate is a low density connection interface and wherein applying a first surface finish comprises applying an electrolytic surface finish.

3. The method of claim 2, wherein the electrolytic surface finish is a NiAu surface finish.

4. The method of claim 2, wherein the low density connection interface is a POP pad area.

5. The method of claim 1, wherein the high density connection interface comprises a C4 area.

6. The method of claim 1, further comprising:
    forming a mask on the first and second areas of the substrate;
    applying a third different finish to a third area of the substrate; and
    removing the mask.

7. The method of claim 6, wherein the first and second areas of the substrate are on a top surface of the substrate and the third area of the substrate is on a bottom surface of the substrate opposite the top surface.

8. The method of claim 7, wherein the third finish is a direct immersion surface.

9. The method of claim 7, wherein the third area of the substrate includes a third different type of contact area.

10. The method of claim 1, further comprising:
    forming a second mask on the second area of the substrate;
    exposing a first area of the substrate before applying the first surface finish; and
    removing the second mask before forming the mask on the first area of the substrate.

11. A method comprising:
    applying a first surface finish to connection pads of a first type located in a first area of a substrate;
    forming a mask on the first area of the substrate and exposing a second area of the substrate;
    applying a second different surface finish to connection pads of a second type located in the second area of the substrate;
    removing the mask;
    forming a second mask on the first and second areas of the substrate;
    applying a third different surface finish to a third area of the substrate; and
    removing the second mask, wherein the first area is on a top surface of the substrate and the third area is on a bottom surface of the substrate opposite the top surface.

12. The method of claim 11, wherein the first and second areas are on a first surface of the substrate and the third area is on a second surface of the substrate opposite and parallel to the first surface.

13. The method of claim 11, wherein the first surface finish is an electrolytic NiAu surface finish and the second different surface finish is an electroless NiPdAu surface finish.

14. The method of claim 11, wherein the third different surface finish is a direct immersion surface.

15. A semiconductor substrate for a package on package having a first low density connection area on one side and a second high density connection area on the one side,
    the first connection area having a first surface finish of NiAu applied to connection pads of the first low density connection area,
    the second connection area having a second surface finish of NiPdAu applied to connection pads of the second high density connection area.

16. The substrate of claim 15, wherein the first surface finish is an electrolytic surface finish and the second surface finish is an electroless surface finish.

17. The substrate of claim 15, further comprising a third connection area on a second side of the substrate, the third connection area having a third different finish.

18. The substrate of claim 17, wherein the third finish is a direct immersion surface.

19. The substrate of claim 17, wherein the first and second areas of the substrate are on a top surface for connection to dies mounted to the top surface of the substrate and the third area of the substrate is on a bottom surface of the substrate for connection to a printed circuit board.

20. The substrate of claim 15, wherein the second high density connection area is surrounded by the first low density connection area.

* * * * *